(12) United States Patent
Raszka

(10) Patent No.: US 6,842,375 B1
(45) Date of Patent: Jan. 11, 2005

(54) METHODS AND APPARATUSES FOR MAINTAINING INFORMATION STORED IN A NON-VOLATILE MEMORY CELL

(75) Inventor: Jaroslav Raszka, Fremont, CA (US)

(73) Assignee: Virage Logic Corporation, Fremont, CA (US)

(*) Notice: Subject to any disclaimer, the term of this patent is extended or adjusted under 35 U.S.C. 154(b) by 61 days.

(21) Appl. No.: 10/313,650

(22) Filed: Dec. 6, 2002

Related U.S. Application Data

(60) Provisional application No. 60/340,149, filed on Dec. 6, 2001.

(51) Int. Cl.[7] .................................................. G11C 16/00
(52) U.S. Cl. ........................... 365/185.18; 365/185.08; 365/185.25
(58) Field of Search ....................... 365/185.08, 185.18, 365/185.25

(56) References Cited

U.S. PATENT DOCUMENTS

| | | | |
|---|---|---|---|
| 4,375,086 A | 2/1983 | Van Velthoven | 365/149 |
| 4,467,457 A | 8/1984 | Iwahashi et al. | 365/228 |
| 4,672,580 A | 6/1987 | Yau et al. | 365/185.08 |
| 4,807,188 A | 2/1989 | Casagrande | 365/185.05 |
| 4,884,241 A | 11/1989 | Tanaka et al. | 365/210 |
| 4,951,257 A | 8/1990 | Imamiya et al. | 365/210 |
| 4,970,691 A | 11/1990 | Atsumi et al. | 365/184.11 |
| 5,251,171 A | 10/1993 | Yamauchi | 365/185.08 |
| 5,299,162 A | 3/1994 | Kim et al. | 365/201 |
| 5,331,597 A | 7/1994 | Tanaka | 365/207 |
| 5,430,670 A | 7/1995 | Rosenthal | 365/45 |
| 5,587,945 A | 12/1996 | Lin et al. | 365/185.1 |
| 5,638,325 A * | 6/1997 | Hamamoto | 365/185.25 |
| 5,668,752 A | 9/1997 | Hashimoto | 365/104 |
| 5,732,022 A | 3/1998 | Kato et al. | 365/185.24 |
| 5,742,542 A | 4/1998 | Lin et al. | 365/185.08 |
| 5,761,121 A | 6/1998 | Chang | 365/185.14 |
| 5,768,186 A | 6/1998 | Ma | 365/185.01 |
| 5,781,489 A | 7/1998 | Okamoto | 365/208 |
| 5,801,076 A | 9/1998 | Ghneim et al. | 438/261 |
| 5,805,013 A | 9/1998 | Ghneim et al. | 257/411 |
| 5,808,953 A | 9/1998 | Kim et al. | 365/226 |
| 5,854,114 A | 12/1998 | Li et al. | 438/296 |
| 5,885,870 A | 3/1999 | Maiti et al. | 438/261 |
| 5,942,780 A | 8/1999 | Barsan et al. | 257/321 |
| 6,018,477 A | 1/2000 | Wang | 365/185.25 |
| 6,064,105 A | 5/2000 | Li et al. | 257/510 |
| 6,069,382 A | 5/2000 | Rahim | 257/316 |
| 6,084,820 A | 7/2000 | Raszka | 365/230.05 |
| 6,094,394 A | 7/2000 | La Rosa | 365/207 |

(List continued on next page.)

OTHER PUBLICATIONS

McPartland et al., "1.25 Volt, Low Cost, Embedded FLASH Memory for Low Density Applications", 2000 Symposium on VLSI Circuits Digest of Technical Papers, pp. 158–161.

Simon J. Lovett, "The Nonvolatile Cell Hidden in Standard CMOS Logic Technologies", IEEE Transactions on Electron Devices, vol. 48, No. 5, May 2001, pp. 1017–1018.

Ohsaki et al., "A Single Polysilicon wafer EEPROM Cell Structure for Use in Standard CMOS Processes", IEEE Journal of Solid–State Circuits, vol. 29*, No. 3, Mar. 1994, pp. 311–316.

*Primary Examiner*—Tan T. Nguyen
(74) *Attorney, Agent, or Firm*—Blakely, Sokoloff, Taylor & Zafman LLP

(57) ABSTRACT

Various apparatuses and methods in which an integrated circuit includes a non-volatile memory cell and a keep mode circuit. The non-volatile memory cell has a charge storage component. The keep mode circuit has a storage device and a keep mode switch. The storage device receives information stored in the non-volatile memory cell. The keep mode switch connects the storage device to the non-volatile memory cell in order to apply a static bias voltage across the charge storage component to restrict charge-loss to a predetermined level.

24 Claims, 8 Drawing Sheets

U.S. PATENT DOCUMENTS

| | | | |
|---|---|---|---|
| 6,295,226 B1 | 9/2001 | Yang | 365/185.01 |
| 6,324,097 B1 | 11/2001 | Chen et al. | 365/185.1 |
| 6,330,186 B2 | 12/2001 | Tanaka | 365/185.11 |
| 6,331,951 B1 | 12/2001 | Bautista, Jr. et al. | 365/185.22 |
| 6,337,808 B1 | 1/2002 | Forbes | 365/185.21 |
| RE37,593 E | 3/2002 | Etoh et al. | |
| 6,370,061 B1 | 4/2002 | Yachareni et al. | 365/185.22 |
| 6,407,946 B2 | 6/2002 | Maruyama et al. | 365/185.2 |
| 6,417,728 B1 | 7/2002 | Baschirotto et al. | 330/9 |
| 6,445,614 B1 | 9/2002 | Tsai et al. | 365/185.09 |
| 6,473,356 B1 | 10/2002 | Raszka | 365/230.03 |
| 6,674,665 B1 * | 1/2004 | Mann et al. | 365/185.08 |
| 2001/0028590 A1 | 10/2001 | Ishikawa et al. | |

* cited by examiner

METHODS AND APPARATUSES FOR MAINTAINING INFORMATION STORED IN A NON-VOLATILE MEMORY CELL

RELATED APPLICATION

This application is a non-provisional application that claims benefit of the file date of U.S. Provisional Patent Application Ser. No. 60/340,149, filed Dec. 6, 2001.

FIELD OF THE INVENTION

Embodiments of the invention generally relate to memory cells and memory devices. More particularly, an aspect of an embodiment of the invention relates to the a keep mode circuit to enhance retention of charge in a non-volatile memory cells over time.

BACKGROUND OF THE INVENTION

Non-volatile memories are those memories that are capable of retaining the data stored in their cells for a significantly long time, usually in excess of ten years, after they were disconnected from a power supply. The use of floating gates in non-volatile memory, and in particular in metal-oxide semiconductor field effect transistors (MOSFET) is common in the art Digital devices include Electrically Programmable Read Only Memory (EPROM), Electrically Erasable Programmable Read Only Memory (EEPROM), and Flash memories. Digital devices typically have a range of a data or other information corresponding generally to a logic value of "0" or a logic value of "1". These devices have a large range of uses in both embedded and stand-alone applications. However, requirements from such memory may vary significantly depending on the specific application in which such memory is to be used. For example, in some cases, the dominant requirement is for the storage of large quantities of data that may require emphasis on the smallest possible cell size. In other cases, the amount of data to be stored is quite small and it is important to ensure that the additional costs that are required for enabling a circuit to be a non-volatile memory are minimized.

An industry requirement for non-volatile memory cells is retention of data stored in a non-volatile memory cell. Retention is the ability to retain the data stored in the cell for an extended period of time after the cell was disconnected from its power source. The typical industry standard for retention is ten years. Charges can be trapped in a memory cell to represent information, such as a logical "1" or a logical "0." Charges can leak out of a memory cell diminishing the ability to sense the logic state of the cell. The loss of charges trapped in a non-volatile memory cell can occur while the device is connected to its power supply. In fact, charge loss may be enhanced during chip operation due to its relatively higher operating temperature that results in a high level of charge-loss. If a memory cell looses enough of its stored charge, it may be impossible or at least impractical to attempt to sense the low residual charge voltage remaining in the cell.

Attempts to address the problem of charge loss take a multitude of ways especially in cases where the charge loss is significantly fast. A common approach to address the problem is through process solutions that provide better ways of trapping charges and keeping them in place. One such attempt can be found in U.S. Pat. Nos. 5,801,076, 5,805,013, by Ghneim et al., where the floating gate can be configured as a stacked or non-stacked pair of polysilicon conductors. Li et al. suggest in U.S. Pat. Nos. 5,854,114 and 6,064,105 a shallow trench isolation (STI) approach designed to maintain sufficient retention in a non-volatile memory cell. Maiti ct al. take the approach of providing a better oxidation to the layers in U.S. Pat. No. 5,885,870 and thereby enhancing the retention of the floating gate device. Increased retention by substantially overlapping or encapsulating the floating gate by the control gate, therefore keeping the gate isolated from other structures, such as sidewall spacers, is another way of addressing the issue and is suggested by Rahim in U.S. Pat. No. 6,069,382. However, all these approaches suggest changes to a process to achieve the goal of better retention. This may prove costly due to the effects on other portions of the design and the departure from a standard and known process flow.

Another approach is to try and correct the charge-loss problem by using circuit solutions. In some cases, this approach may increase the physical size of the non-volatile memory containing all the cells. In U.S. Pat. No. 5,251,171, Yamauchi suggests a circuit to achieve the goal of higher retention of a non-volatile memory cell. The circuit couples the non-volatile cell and a capacitor capable of storing charges. This capacitor is charged periodically, similar to the refresh process in a dynamic random access memory (DRAM). By applying the capacitor to the non-volatile memory cell its charge loss is reduced. Another approach to refresh, suitable also for multilevel applications, is suggested by Wang in U.S. Pat. No. 6,018,477. Using a sensing device and a comparator a trigger is generated to cause a refresh of the cell upon charge-loss potentially causing the change in the content of the non-volatile memory cell. As a result of the trigger, the cell is reprogrammed to ensure proper operation. A problem with the refresh approach is that due to a rapid charge loss of the DRAM capacitor relatively frequent refreshes can be necessary. The frequent refreshes occur due to the relatively small capacitor size that can be integrated in such a cell, and because the discharge time is directly proportionate to the value of the capacitor, which is small to begin with. In applications that are power consumption sensitive, the frequent refreshing may deprive a significant number of use hours from the user.

FIG. 1 illustrates a graph showing typical loss of charge in a non-volatile memory cell over time. The graph illustrates an initial charge 105 stored by the non-volatile memory cell. The charge 110 stored by the non-volatile memory cell decreases over time. After programming, the discharge of a non-volatile memory cell discharge begins moving towards a residual value. A sufficient margin 120 should exist between the maximum sensing error and the stored charge to read the data stored by the cell and receive valid results. However, over time the charge loss becomes significant and falls below a sensing threshold voltage, indicated by line 120. Below the sensing threshold voltage 120 it may be impossible to distinguish between the programmed and erased values of the cell, resulting in an erroneous readout.

Also, the loss of charge 110 stored in the non-volatile memory cell may be accelerated by higher than normal operating temperatures. The accelerated charge loss can result in an overall retention being significantly below an industry standard for non-volatile memory cells.

SUMMARY OF THE INVENTION

Various apparatuses and methods in which an integrated circuit includes a non-volatile memory cell, a storage device, and a keep mode circuit. The non-volatile memory cell has a charge storage component. The keep mode circuit has a storage device and a keep mode switch. The storage device receives information stored in the non-volatile memory cell. The keep mode switch connects the storage device to the non-volatile memory cell in order to apply a static bias voltage across the charge storage component to restric charge-loss to a predetermined level.

BRIEF DESCRIPTION OF THE DRAWINGS

The drawings refer to embodiments of the invention in which.

Figure 1:
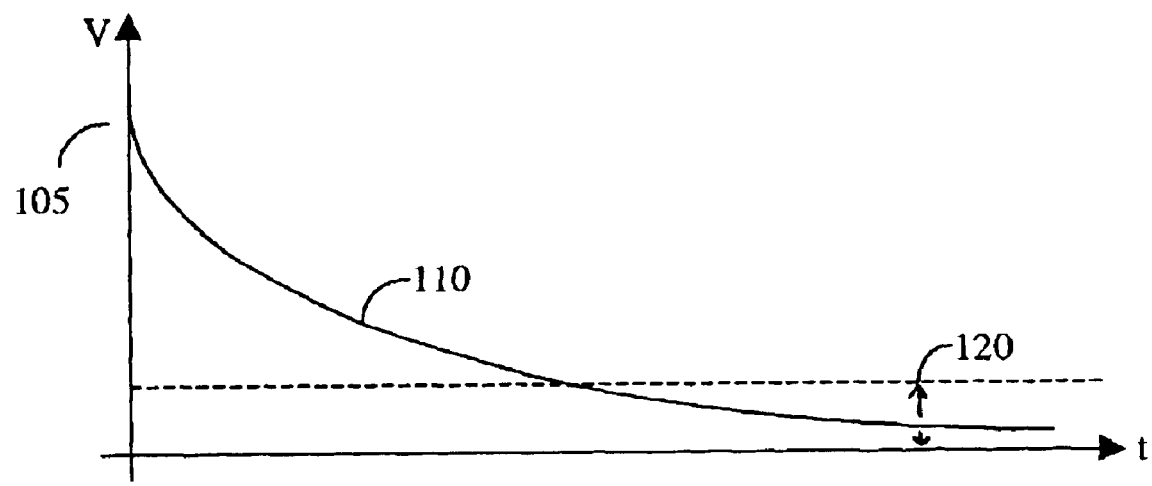
FIG. 1 illustrates a graph showing typical loss of charge in a non-volatile memory cell over time.

While the invention is subject to various modifications and alternative forms, specific embodiments thereof have been shown by way of example in the drawings and will herein be described in detail. The invention should be understood to not be limited to the particular forms disclosed, but on the contrary, the intention is to cover all modifications, equivalents, and alternatives falling within the spirit and scope of the invention.

DETAILED DISCUSSION

In the following description, numerous specific details are set forth, such as examples of specific data signals, named components, connections, number of memory columns in a group of memory columns, etc., in order to provide a thorough understanding of the present invention. It will be apparent, however, to one of ordinary skill in the art that the present invention may be practiced without these specific details. In other instances, well known components or methods have not been described in detail but rather in a block diagram in order to avoid unnecessarily obscuring the present invention. Further specific numeric references such as first non-volatile memory cell, may be made. However, the specific numeric reference should not be interpreted as a literal sequential order but rather interpreted that the first non-volatile memory cell is different than a second non-volatile memory cell. Thus, the specific details set forth are merely exemplary. The specific details may be varied from and still be contemplated to be within the spirit and scope of the present invention. The term coupled is defined as meaning connected either directly to the component or indirectly to the component through another component.

In general, various apparatuses and methods are described in which a keep mode circuit cooperates with a non-volatile memory cell to restrict loss of charge stored in the non-volatile memory cell over time. The keep mode circuit applies a bias voltage across a charge storage component in the non-volatile memory cell, such as a capacitor or floating gate. The bias level clamps the discharge of a non-volatile memory cell voltage at a value that still allows for a valid sensing of a logic state stored by the non-volatile memory cell.

Figure 2A:
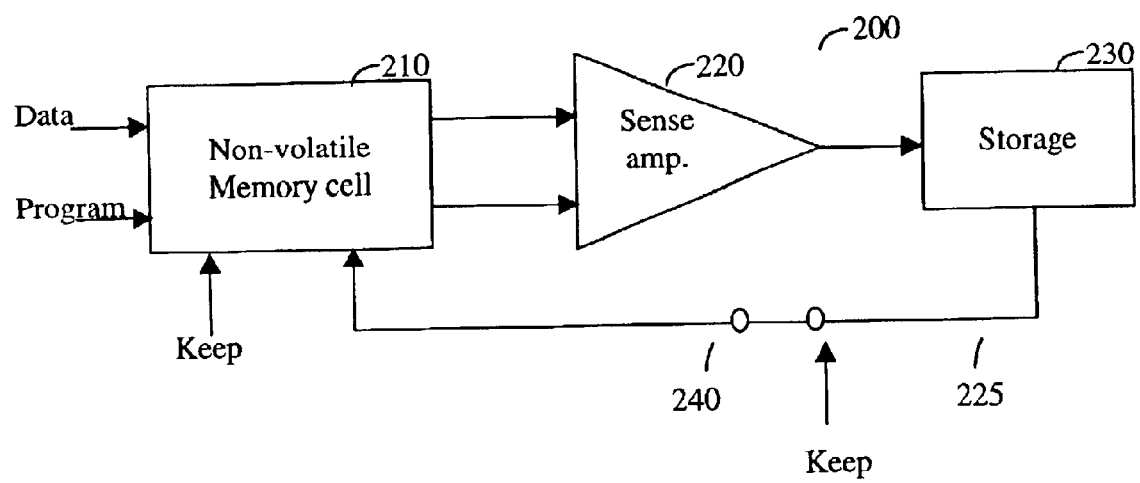
FIG. 2A illustrates a block diagram of an embodiment of a circuit that includes a non-volatile memory cell, a storage device, and a keep mode circuit.

FIG. 2A illustrates a block diagram of an embodiment of a circuit that includes a non-volatile memory cell and a keep mode circuit. Circuit 200 is comprised of a non-volatile memory cell 210, a sense amplifier 220, and a keep mode circuit 225. The non-volatile memory cell 210 may have a charge storage component, such as a capacitor, floating gate, multiple capacitors in a dual polarity cell, multiple floating gates in a dual polarity cell, or other similar storage components. The keep mode circuit 225 has a storage device 230 and a keep mode switch 240. The storage device 230 receives data stored in the non-volatile memory cell 210 and generates a bias voltage. A sense amplifier 220 connects to an output of the non-volatile memory cell 210. The storage device 230 connects to an output of the sense amplifier 220. The keep mode circuit 225 connects the storage device 230 to the non-volatile memory cell 210 through the keep mode switch 240. The keep mode circuit 225 includes one or more keep mode switches 240, such as a transistor or other controllable on/off device. The keep mode switches 240 may receive a control signal to connect to the non-volatile memory cell 210 in order to apply a bias voltage across the charge storage component to restrict charge-loss to a predetermined level.

A programming circuit programs the information into the non-volatile memory cell 210 by applying data and a programming voltage. The sense amplifier 220 detects the information, typically a logical "1" or "0", stored in the non-volatile memory cell 210. The sense amplifier 220 generates an output value that reflects the logic state of the non-volatile memory cell 210. The output of sense amplifier 220 is fed to a storage device 230 that loads the corresponding information. The storage device 230 may include, but is not limited to, a static random access memory (SRAM) cell, a DRAM cell, and others similar storage devices.

Once a control circuit detects that programming of the charge storage component in the non-volatile memory cell 210 is over, then the control circuit enables the keep mode circuit 225. The circuit 200 clamps the charge-loss in the non-volatile memory cell 210 to equal or above a predetermined value. The predetermined level is at least above a minimal sensing level to perform a valid read operation on information being stored in the non-volatile memory cell 210. The minimum sensing level is a function of the capabilities of the sense amplifier 220. The keep mode switch 240 connects the output of the storage device 230 to the non-volatile memory cell 210 after programming of the non-volatile memory cell 210 is performed. As the storage device 230 has a feedback path to non-volatile memory cell 210, it is possible to provide a bias voltage that results in increasing the level of the nominal voltage across the capacitive divider network from, for example zero, to another predetermined voltage, sufficiently above the minimal sensing voltage required.

In an embodiment, the keep mode circuit 225 may suspend the application of the static bias voltage across the charge component when the non-volatile cell is being programmed.

The storage device 230, via the keep mode switch 240, applies a static bias voltage across the charge storage component. If left alone indefinitely, the storage device 230 may switch from one state to another. Upon detecting that the voltage level in the storage device 230 reaches approximately the predetermined level, the sense amplifier may refresh the voltage stored in the storage device 230. In an embodiment, the sense amplifier 220 may periodically reinforce information stored in the storage device 230 equal to or greater than once per hour, once per day, etc. In comparison, using DRAM solutions proposed in prior art may require a refresh several times per second, in most cases hundreds of time, due to the relatively small capacitor that can be integrated with the non-volatile memory cell.

Figure 2B:
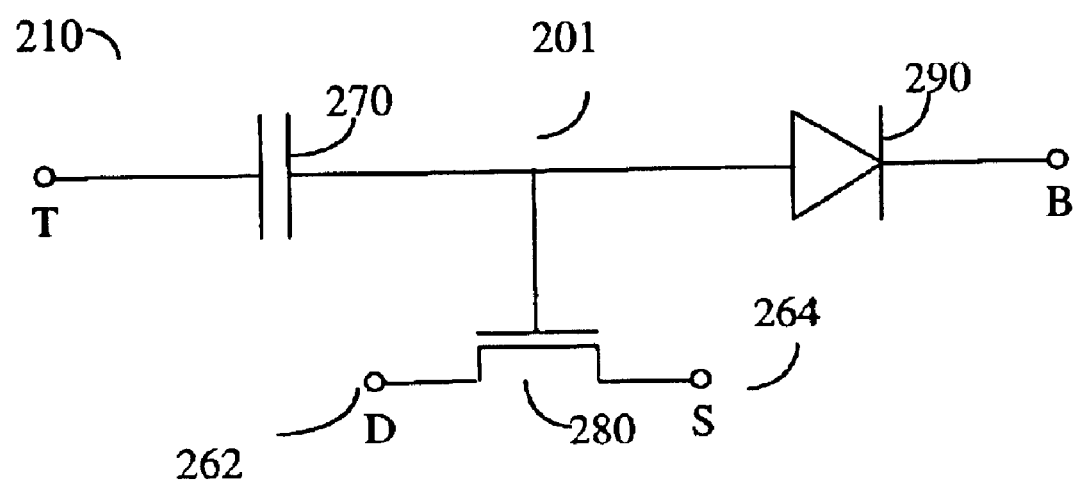
FIG. 2B illustrates a schematic drawing of an embodiment of a non-volatile memory cell.

FIG. 2B illustrates a schematic drawing of an embodiment of a non-volatile memory cell. The example non-volatile memory cell 210 consists of a tunneling capacitor 290, the coupling capacitor 270 and the read transistor 280. These three components share a single floating gate 201. The coupling capacitor 270 in conjunction with the tunneling capacitor 290 form the charging component. The coupling capacitor 270 can be charged, i.e., programmed, through the tunneling capacitor 290, by applying the programming voltages across the B terminal and T terminal. Similarly, the coupling capacitor 270 can be discharged, i.e., erased, by applying the erase voltages across the B terminal and T terminal.

Figure 4:
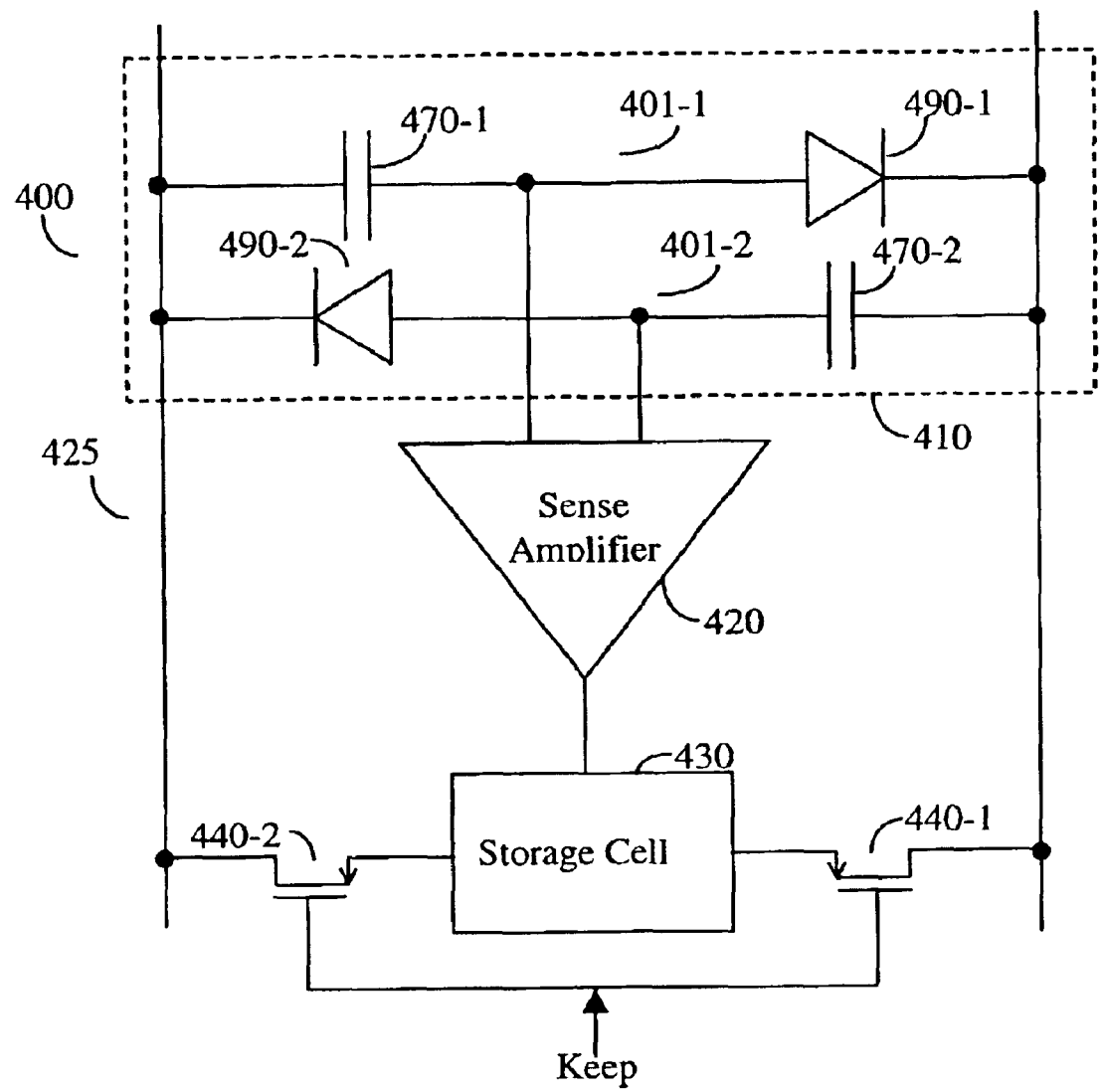
FIG. 4 illustrates a schematic diagram of an embodiment of a circuit to apply a static bias voltage across the charge storage component at a value that still allows for a valid sensing of a logic state stored by an example dual polarity non-volatile memory cell.

Referring to FIG. 4, coupling capacitor 470-1 can be charged through the tunneling capacitor 490-1, by applying the programming voltages across the B terminal and T terminal. At the same time, coupling capacitor 470-2 is charged in the opposite polarity through the tunneling capacitor 490-2.

Referring to FIG. 2B, the read transistor 280 communicates the information stored in non-volatile memory cell 210 during a read operation. Thus, the charge operation enables retention of information after the power is turned off, while the sense operation allows the previously stored information to be accessed after powering the memory back up. An embodiment of this uni-polarity non-volatile electrically-alterable memory cells, is disclosed in detail in U.S. patent application entitled, "ELECTRICALLY-ALTERABLE NON-VOLATILE MEMORY CELL" Ser. No. 10/295,742 filed on Nov. 15, 2002.

Figure 3:
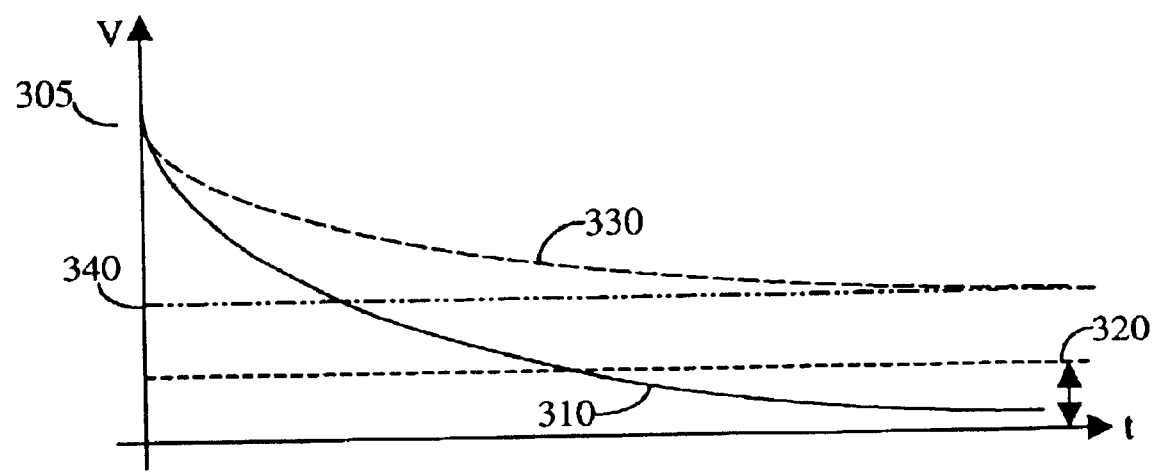
FIG. 3 illustrates a graph showing an example loss of charge that is clamped by an embodiment of the keep mode circuit.

FIG. 3 illustrates a graph showing an example loss of charge that is clamped by an embodiment of the keep mode circuit. The graph illustrates an initial charge 305 stored by the non-volatile memory cell after programming. The charge 310 stored by the non-volatile memory cell decreases over time. The loss of charge 330 stored by the non-volatile memory cell may be restricted and clamped to a predetermined level. The discharge of a non-volatile memory cell begins towards a residual positive value. A sufficient margin 320 exists to read the data stored by the cell and receive valid results. The loss of charge 310 in the non-volatile cell may be accelerated by higher than normal operating temperatures. The keep mode circuit applies a static bias voltage across the charge storage component to restric the loss of charge 330 from the non-volatile memory cell. The static bias voltage level may correlate to a voltage level sensed inside the capacitive divider network storing the charge. The static bias voltage level 340 clamps loss of charge at a value that still allows for a valid sensing of a logic state stored by the non-volatile memory cell.

Prior to applying the bias shown as line 340, charge loss in high temperature environment could be in accordance with line 310 crossing over the minimum sensing level voltage 320 within a short period of time. However, due to the application of the bias, charge loss 330 is reduced so that it does not go below the level shown by bias voltage line 340. Two results are achieved: the first is that speed of the loss of charge is reduced; and the second is, despite the charge-loss, the residual voltage is still significantly above the minimal sensing value 320. An advantage aver prior art is achieved as this circuit operate statically to maintain the bias voltage level 340 and that a reduced amount charge leakage is to be compensated for. This is particularly true when the storage device is, for example, a SRAM cell.

FIG. 4 illustrates a schematic diagram of an embodiment of a circuit to apply a static bias voltage across the charge storage component at a value that still allows for a valid sensing of a logic state stored by an example dual polarity non-volatile memory (DPNVM) cell. The DPNVM cell 410 is comprised of two coupling capacitors 470-1 and 470-2, two tunneling capacitors 490-1 and 490-2, and two floating gates 401-1 and 401-2. Specifically, the DPNVM cell is capable of storing the data provided to the cell in a dual polarity, i.e., one branch stores the data in a positive polarity while the other branch of the cell stores the data in the negative polarity. This provides generally for higher retention capability as a differential rather then a uni-sided value. The sense amplifier 420 may be a differential sense amplifier to detect the difference between the positive charge value stored in, for example, coupling capacitor 470-1 and the negative charge value stored in coupling capacitor 470-2. As long as the differential value is above the sensing threshold, successful sensing can be achieved. The sense amplifier 420 stores the sensed data value in storage device 430. An embodiment of this DPNVM cell, is disclosed in detail in U.S. patent application entitled, "METHODS AND APPARATUSES FOR A DUAL-POLARITY NON-VOLATILE MEMORY CELL" Ser. No. 10/313,199 filed on Dec. 6, 2002.

Once the DPNVM cell 410 is programmed, it is possible to maintain charge stored by each branch by applying the keep signal to the keep mode circuit 425. The Keep signal causes transfer gates 440-1 and 440-2 to be conductive. The static voltage stored in storage cell 430 correlates to the logic value stored by the dual polarity non-volatile memory cell. The storage device 430 supplies the static bias voltage through the feedback path to across the charge storage components 470-1, 401-1, 490-1, 470-2, 490-2, and 401-2. The bias voltage increases the level of the nominal voltage across the capacitive divider network from, for example zero, to another predetermined voltage, sufficiently above the minimal sensing voltage required. For example, in an example case of a logical "1" being stored by the non-volatile memory cell, the initial static bias voltage from the storage cell may be, for example, 1800 millivolts.

Further, after the initial programming, coupling capacitor 470-1 may store 400 millivolts of positive charge and coupling capacitor 470-2 may store minus 400 millivolts of negative charge. The 1800 millivolts of bias voltage across each set of coupling capacitor and tunneling capacitor acts to do two things. The raising of the voltage value sensed across the capacitor set slows down the loss of charge. Further, each set of coupling capacitor 270-1, 270-2 and tunneling capacitor 290-1, 290-2 form a capacitive voltage divider network. The bias voltage potential across that capacitive divider network establishes a minimum level that the stored charge can discharge to.

Thus, the bias voltage keeps the nodes DPNVM 410 from discharging below the desired level determined by line 140-P for the positive polarity branch of the cell and 140-N for the negative polarity branch of the cell. The bias voltage restricts the charge loss to a positive value for the positive polarity of the dual polarity non-volatile memory cell and a negative value for the negative polarity of the dual polarity non-volatile memory cell. The predetermined level is at least above a minimal positive sensing level for the positive polarity of the dual polarity non-volatile memory cell and a minimal negative sensing level for the negative polarity of the DPNVM cell.

Note, during circuit operation, the loss of charge in the non-volatile cell may be accelerated by higher than normal operating temperatures. For example, a temperature greater than 100 degree C. is a higher than normal operating temperature in a non-volatile cell that has a normal operating temperature range of 0–85 degree C. However, in an embodiment, the use of the static bias voltage across the charge storage component reduces that loss of charge. Further, the sense amplifier refreshes the voltage value stored in the storage cell on period basis, which can be, for example, once per hour.

Figure 5:
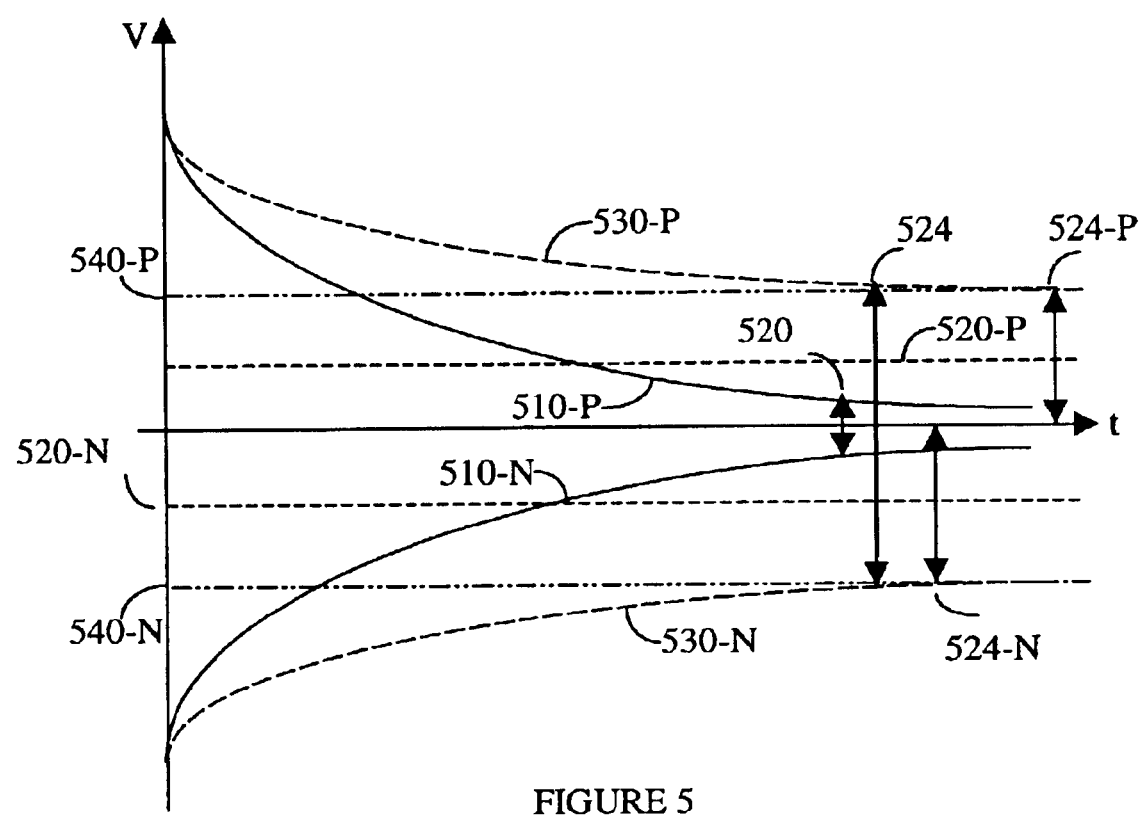
FIG. 5 illustrates a graph showing an example loss of charge in a dual polarity non-volatile memory cell that is clamped by an embodiment of the keep mode circuit.

FIG. 5 illustrates a graph showing an example loss of charge in a dual polarity non-volatile memory cell that is clamped by an embodiment of the keep mode circuit. The loss of charge 530-P and 530-N stored by the non-volatile memory cell may be restricted and clamped to a predetermined level by the application of the bias voltage via the keep mode circuit. In the absence of the keep mode, the positive polarity branch of DPNVM cell could have charge loss depicted by line 510-P and the negative polarity branch of DPNVM cell could have the charge loss depicted by line 510-N. However, the bias voltage keeps the nodes DPNVM from discharging below the desired level determined by line 540-P for the positive polarity branch of the cell and 540-N for the negative polarity branch of the cell. Therefore, the voltage difference sensed 524 by sense amplifier of a programmed DPNVM cell can be significantly above the minimal sensing threshold 520 to obtain a valid read of the DPNVM cell. Further, the voltage 524-P, 524-N sensed by sense amplifier of each branch of a programmed DPNVM cell can be significantly above the minimal sensing threshold 520-P, 520-N to obtain a valid read of the each branch independent of the other branch in the DPNVM cell. In this case, activation of the keep mode circuit occurs immediately after completion of programming; however, it is possible to delay such activation to a later time.

Figure 6:
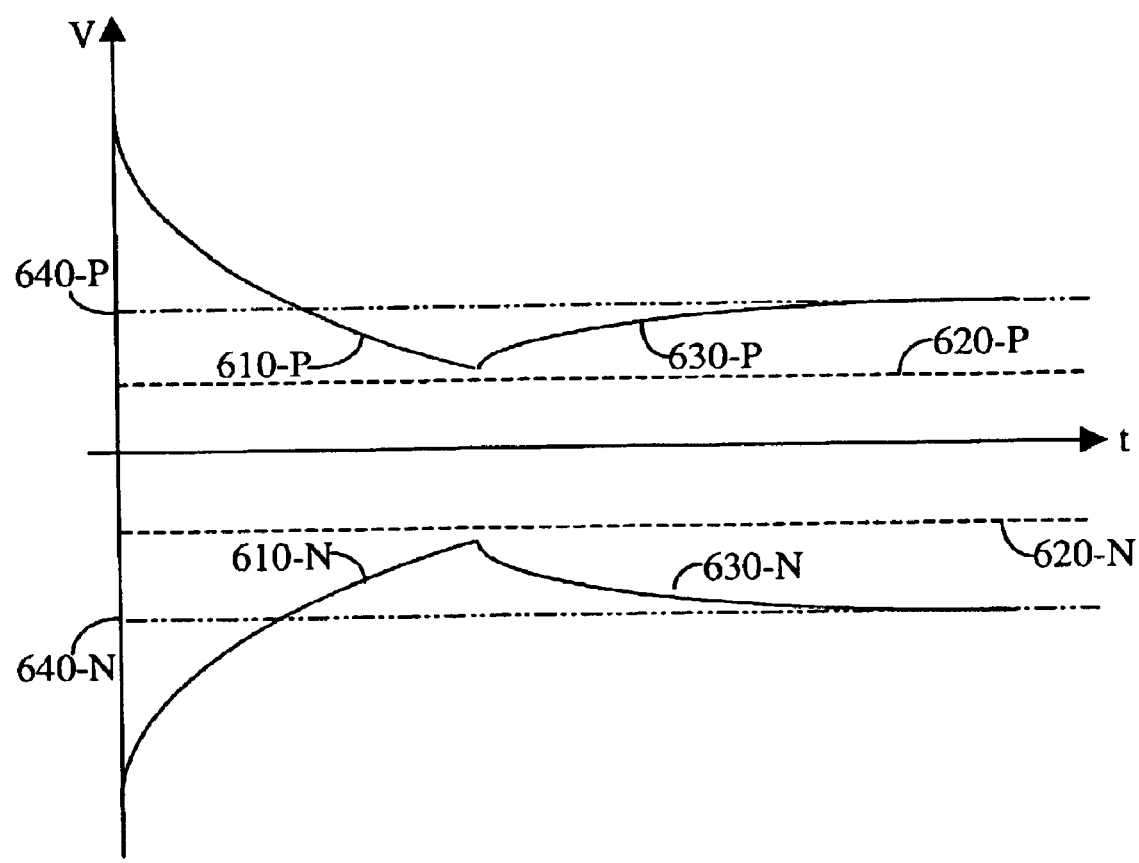
FIG. 6 illustrate a graph of an example discharge of a non-volatile memory cell and subsequent activation of an embodiment of the keep mode circuit.

FIG. 6 illustrate a graph of an example discharge of a non-volatile memory cell and subsequent activation of an embodiment of the keep mode circuit. In the absence of the keep mode signal activating the bias voltage feedback path, the positive polarity branch of DPNVM cell could have charge loss depicted by line 610-P and the negative polarity branch of DPNVM cell could have the charge loss depicted by line 610-N. The bias voltage from the keep node circuit establishes a minimum voltage potential to be stored in the capacitor divider network, determined by line 640-P for the positive polarity branch of the cell and 640-N for the negative polarity branch of the cell. The keep mode circuitry may receive a control signal to activate after the charge storage component has discharged below the minimum levels determined by the bias voltage 640-P, 640-N. The keep mode circuitry re-charges the charge storage component up to at least the predetermined level upon activating the keep mode circuitry after charge levels of the non-volatile memory cell have fallen below the predetermined level.

A single poly standard CMOS manufacturing process may create the electrically-alterable dual-polarity non-volatile memory cell. The non-volatile memory solution for embedded and stand alone applications integrates easily with the standard single poly CMOS processes.

A memory compiler may be used to generate a DPNVM based memory array in any designated width and length. The generated design can be embedded within a larger target chip and implemented on a mask set used for the manufacture of such target chip. Multiple DPNVM cells, such as 4K, 16K, etc., may be arranged in columns and rows to form a long term memory for an integrated circuit. Further, one or more DPNVM can share a single storage device and/or a single keep mode circuit. In this case, the keep mode circuit selectively, such as via a multiplexer, completes the feedback path from the storage device to across the charge storage component in each DPNVM.

Figure 7:
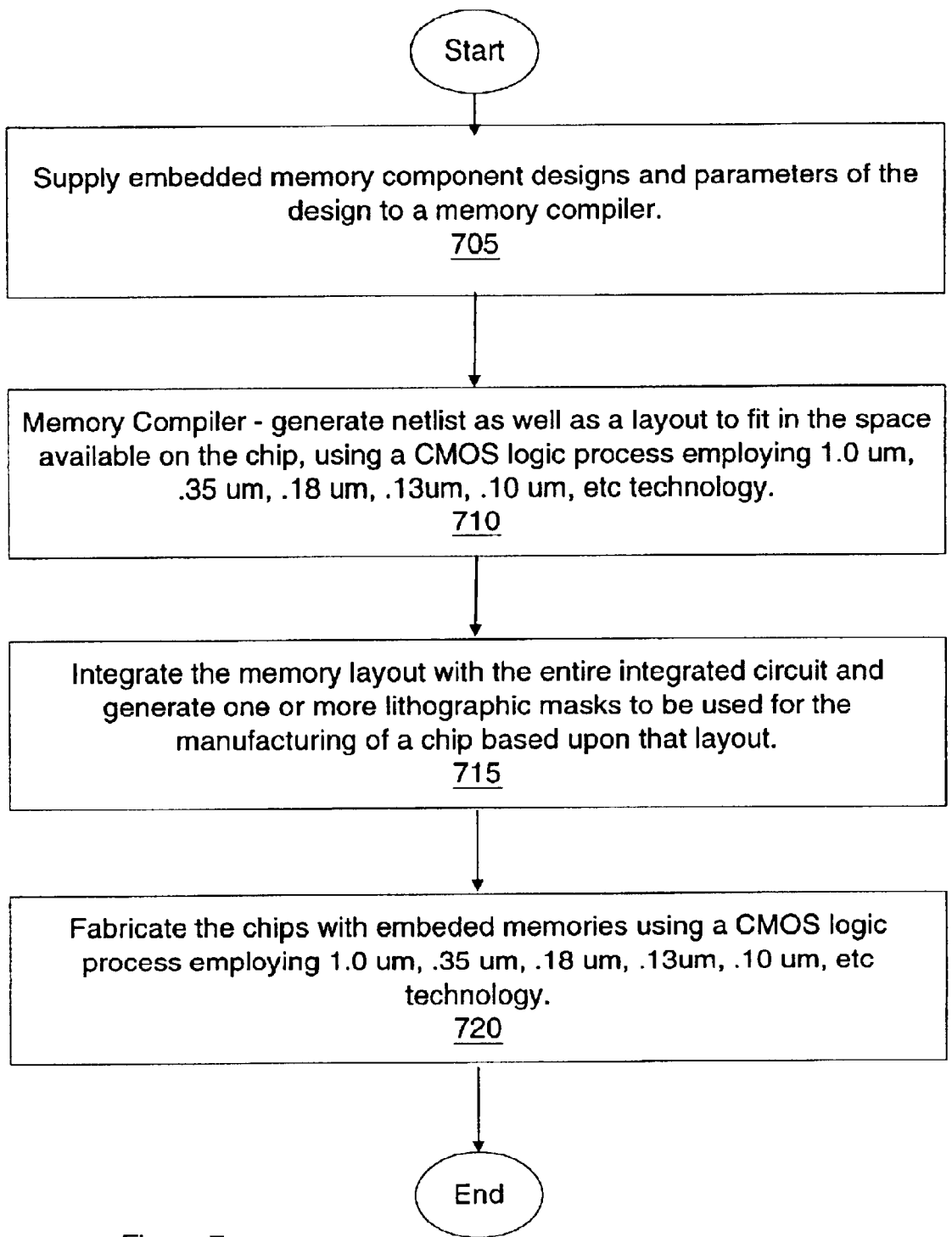
FIG. 7 illustrates an example process of generating an embedded memory from designs of memory components with an embodiment of a memory compiler.

FIG. 7 illustrates an example process of generating an embedded memory from designs of memory components with an embodiment of a memory compiler.

In block 705, the designs for each memory component for the embedded memory are supplied to the memory compiler, as well as other design parameters such as the number of columns and number of rows of the array, the available size on the chip and others. Thus, the designs for one or more a circuits that include one or more non-volatile memory cells and keep mode circuits in a given System On a Chip (SoC) may be supplied to the memory compiler. A memory compiler may be a software program comprised of multiple algorithms and designs for the purpose of generating a circuit design and a layout in a space available on a target chip. The set of application-specific algorithms and interfaces of the memory compiler may be used by system IC integrators to rapidly create hundreds of silicon-proven memory cores. The memory compiler receives the memory component designs and utilizes those memory component designs in conjunction with memory circuit designs to optimize a circuit design and layout in the space available on a target chip. For example, the non-volatile memory cell, sense amplifier, keep mode circuit, etc. may be a basic memory building blocks utilized in a design of a non-volatile random access memory compiler.

In block 710, the memory compiler generates a netlist and a layout targeted to fit in the space available on a target chip. The memory compiler stores the data representing the embedded memory typically on a machine-readable medium. The memory compiler selects the memory component building blocks so that they are sized appropriate for the targeted fabrication technology. The memory compiler then provides the memory layout to be used to generate one or more lithographic masks to be used in the fabrication of that embedded memory. The memory compiler also provides a netlist for verification of the embedded memory.

In block 715, the memory layout generated is integrated with the rest of the layout for the chip and a machine generates the lithographic masks that contain the information necessary for the fabrication of a functional device. The machine generates one or more lithographic masks to be used to transfer that circuit design onto the chip. The non-volatile memory solution for embedded applications integrates easily with standard single poly CMOS processes.

In block 720, a fabrication facility fabricates the chips with the embedded memories using the lithographic masks generated from the memory compiler's circuit design and layout. Fabrication facilities may use a standard CMOS logic process having minimum line widths such as 1.0 um, 0.50 um, 0.35 um, 0.25 um, 0.18 um, 0.13 um, 0.10 um, 90 nm, or less to fabricate the chips. The size of the CMOS logic process employed typically defines the smallest minimum lithographic dimension that can be fabricated on the chip using the lithographic masks, which in turn determines minimum component size. In an embodiment, light is shown through these lithographic masks onto the chip to transfer the circuit design and layout for the embedded memory onto the chip itself. In an embodiment, the embedded memory containing one or more electrically-alterable non-volatile memory cell can be embedded into a SoC and can be fabricated in a state-of-the-art, leading edge standard logic process with no additional process steps or additional special masks. In an embodiment, the electrically-alterable non-volatile memory cell compiler is designed for embedded applications in the standard CMOS logic process.

In one embodiment, the software used to facilitate the memory compiler can be embodied onto a machine-readable medium. A machine-readable medium includes any mechanism that provides (e.g., stores and/or transmits) information in a form readable by a machine (e.g., a computer). For example, a machine-readable medium includes read only memory (ROM); random access memory (RAM); magnetic disk storage media; optical storage media; flash memory devices; DVD's, electrical, optical, acoustical or other form of propagated signals (e.g., carrier waves, infrared signals, digital signals, EPROMs, EEPROMs, FLASH, magnetic or optical cards, or any type of media suitable for storing electronic instructions. Slower mediums could be cached to a faster, more practical, medium.

Some portions of the detailed descriptions above are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussions, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers, or other such information storage, transmission or display devices.

In an embodiment, an example memory compiler may comprise the following. A graphic user interface, a common set of processing elements, and a library of files containing design elements such as circuits, control logic, and cell arrays that define the complier. In an embodiment, object code in a set of executable software programs. A nonvolatile random access memory compiler architecture that includes one or more electrically-alterable non-volatile memory cells is a serial/parallel memory featuring a static random access memory (SRAM) section overlaid bit-for-bit with a non-volatile electrically alterable read only memory (EAROM). The nonvolatile random access memory compiler is designed for embedded applications in the logic process. No additional special masks or special process steps are required. The nonvolatile random access memory design allows data to be easily transferred from SRAM to EAROM section (STORE operation) and back from EAROM to SRAM section (RECALL operations). The STORE and RECALL operations work simultaneously with all memory bits. The STORE operation may be usually completed in less than 300 ms (around 20 us per bit for the largest 16384 bit instance) and the RECALL operation is completed in 10 us or less (around 0.6 ns per bit for the largest 16384 bit instance).

The nonvolatile random access memory is designed for unlimited serial and parallel access to the SRAM section and minimum of 1000 STORE operations to the EAROM. Data retention is specified to be greater than 10 years in power off state (storage) or idle mode and unlimited in the keep mode. Endurance (data changes per bit) is specified to be 100 or more.

For applications where low pin count interface is essential a serial access port can be used (SHIFT cycle). During the SHIFT cycle the SRAM section is reconfigured as a single long shift register and data can be shifted serially in via the serial input (SI) pin and observed on the serial output (SO) pin.

As noted, in an embodiment, a designer chooses the specifics of the memory configuration to produce a set of files defining the requested memory instances. A memory instance may include front end views and back end files. The front end views support documentation, simulation, debugging, and testing. The back end files, such as a layout, physical LEF, etc are for layout and fabrication.

While some specific embodiments of the invention have been shown the invention is not to be limited to these embodiments. For example, the doping of the components may be reversed for implementing a NMOS structure. Geometric arrangements of the components may change. Information may be data, instructions, etc. Dopings of the components may change, etc. The keep mode circuit may have multiple storage devices. The sense amplifier may be used with a multiplexer to convey the differential charge stored by both floating gates. The invention is to be understood as not limited by the specific embodiments described herein, but only by scope of the appended claims.

I claim:

1. An integrated circuit, comprising:
   a non-volatile memory cell having a charge storage component; and
   a keep mode circuit including a storage device to receive information stored in the non-volatile memory cell, and a first switch operable to connect to the non-volatile memory cell in order to apply a static bias voltage across the charge storage component to restrict charge-loss to a predetermined level.

2. The integrated circuit of claim 1, wherein the predetermined level is above a minimal sensing level.

3. The integrated circuit of claim 1, wherein the storage device generates the static bias voltage to resist charge-loss in the non-volatile memory cell.

4. The integrated circuit of claim 1, wherein the keep mode circuitry re-charges the charge storage component up to at least the predetermined level upon activating the keep mode circuit after charge levels of the non-volatile memory cell have fallen below the predetermined level.

5. The integrated circuit of claim 1, wherein the keep mode circuitry is shared among one or more non-volatile memory cells.

6. The integrated circuit of claim 1, wherein the storage device is a static random access memory or a dynamic random access memory.

7. The integrated circuit of claim 1, wherein the non-volatile memory cell is a dual polarity non-volatile memory cell.

8. The integrated circuit of claim 7, wherein restricting the charge loss is to a positive value for a positive polarity of the dual polarity non-volatile memory cell and a negative value for a negative polarity of the dual polarity non-volatile memory cell.

9. The integrated circuit of claim 7, wherein the predetermined level is above a minimal positive sensing level for a positive polarity of the dual polarity non-volatile memory cell and a minimal negative sensing level for a negative polarity of the dual polarity non-volatile memory cell.

10. An integrated circuit, comprising:
a non-volatile memory cell having a charge storage component;
a sense amplifier connected to an output of the non-volatile memory cell; and,
a keep mode circuit including a storage device connected to the output of the sense amplifier and a first switch operable to connect to the non-volatile memory cell in order to apply a static bias voltage across the charge storage component.

11. The integrated circuit of claim 10, wherein the non-volatile memory cell is a dual polarity non-volatile memory cell.

12. The integrated circuit of claim 10, wherein the first switch periodically connects an output of the storage device to the non-volatile memory cell after programming of the non-volatile memory cell is performed.

13. The integrated circuit of claim 10, wherein the sense amplifier periodically reinforces information stored in the storage device equal to or greater than once per hour.

14. The integrated circuit of claim 10, wherein the sense amplifier is a differential sense amplifier.

15. A method to prevent loss of charge stored in a non-volatile memory cell over time, comprising:
storing charge in a charge storage component in a dual polarity non-volatile memory cell; and
applying a static bias voltage across the charge storage component at a value that still allows for a valid sensing of a logic state stored by the dual polarity non-volatile memory cell.

16. The method of claim 15, further comprising:
suspending the application of the static bias voltage across the charge storage component when the non-volatile cell is being programmed.

17. The method of claim 15, further comprising:
periodically reinforcing information stored in the storage device equal to or greater than once per hour.

18. An apparatus, comprising:
means for storing charge in a charge storage component in a dual polarity non-volatile memory cell; and
means for applying a static bias voltage across the charge storage component at a value that still allows for a valid sensing of a logic state stored by the dual polarity non-volatile memory cell.

19. The apparatus of claim 18, further comprising:
means for sensing a logic state indicated by charge stored in the charge storage component; and
means for supplying the logic state to the means for applying the static bias voltage.

20. The apparatus of claim 18, further comprising:
means for suspending the application of the static bias voltage across the charge storage component when the non-volatile cell is being programmed.

21. A machine-readable medium that stores data representing a memory that includes
a circuit comprising:
one or more non-volatile memory (DPNVM) cells including a first non-volatile memory cell having a charge storage component;
a storage device to receive information stored in the first non-volatile memory cell; and
a keep mode circuit connected to the storage device, the circuit including a first switch operable to connect to the non-volatile memory cell in order to apply a bias voltage across the charge storage component to restrict charge-loss to a predetermined level.

22. The machine readable medium of claim 21, wherein the machine readable medium comprises a memory compiler to provide a layout utilized to generate one or more lithographic masks used in fabrication of the memory.

23. The machine-readable medium of claim 21, wherein the memory is an embedded memory.

24. The machine-readable medium of claim 21, wherein the first non-volatile memory cell is a dual-polarity non-volatile memory cell.

* * * * *